(12) United States Patent
Yoon et al.

(10) Patent No.: US 10,903,817 B2
(45) Date of Patent: Jan. 26, 2021

(54) BULK ACOUSTIC WAVE RESONATOR AND METHOD OF MANUFACTURING THE SAME

(71) Applicant: Samsung Electro-Mechanics Co., Ltd., Suwon-si (KR)

(72) Inventors: Sang Kee Yoon, Suwon-si (KR); Nam Soo Park, Suwon-si (KR); Hyung Jae Park, Suwon-si (KR); Tae Kyung Lee, Suwon-si (KR); Moon Chul Lee, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 133 days.

(21) Appl. No.: 16/196,453

(22) Filed: Nov. 20, 2018

(65) Prior Publication Data

US 2019/0356301 A1    Nov. 21, 2019

(30) Foreign Application Priority Data

May 17, 2018 (KR) .................. 10-2018-0056701

(51) Int. Cl.
*H03H 9/17* (2006.01)
*H03H 3/02* (2006.01)
(Continued)

(52) U.S. Cl.
CPC ....... *H03H 9/174* (2013.01); *H01L 21/32135* (2013.01); *H03H 3/02* (2013.01);
(Continued)

(58) Field of Classification Search
CPC .. H03H 9/174; H03H 9/173; H03H 2003/023; H03H 2003/021; H03H 3/02; H03H 9/02047; H01L 21/32135
(Continued)

(56) References Cited

U.S. PATENT DOCUMENTS 7,943,412 B2    5/2011  Buchwalter et al.
2008/0032439 A1  2/2008  Yan et al.
(Continued)

FOREIGN PATENT DOCUMENTS

JP   2001-244769 A   9/2001
JP   2008-113401 A   5/2008
(Continued)

OTHER PUBLICATIONS

Korean Office Action dated Sep. 10, 2019 in counterpart Korean Patent Application No. 10-2018-0056701 (5 pages in English and 4 pages in Korean).
(Continued)

*Primary Examiner* — Rakesh B Patel
*Assistant Examiner* — Jorge L Salazar, Jr.
(74) *Attorney, Agent, or Firm* — NSIP Law

(57) ABSTRACT

A method of manufacturing a bulk acoustic wave resonator includes: forming a sacrificial layer on a substrate protection layer; forming a membrane layer on the substrate protection layer to cover the sacrificial layer; and forming a cavity by removing the sacrificial layer using a gas mixture comprising a halide-based gas and an oxygen-containing gas, wherein a mixture ratio of the halide-based gas to the oxygen-containing gas in the gas mixture is in a range from 1.5 to 2.4.

18 Claims, 13 Drawing Sheets

(51) Int. Cl.
*H01L 21/3213* (2006.01)
*H03H 9/02* (2006.01)

(52) U.S. Cl.
CPC ........ *H03H 9/02047* (2013.01); *H03H 9/173* (2013.01); *H03H 2003/021* (2013.01); *H03H 2003/023* (2013.01)

(58) Field of Classification Search
USPC ........................................ 333/133, 187, 188
See application file for complete search history.

(56) References Cited

U.S. PATENT DOCUMENTS

| | | |
|---|---|---|
| 2009/0071932 A1 | 3/2009 | Floyd et al. |
| 2009/0074646 A1 | 3/2009 | Sasagawa et al. |
| 2009/0200899 A1 | 8/2009 | Osaka et al. |
| 2012/0244715 A1 | 9/2012 | Lebouitz et al. |
| 2014/0361664 A1* | 12/2014 | Taniguchi ............. H03H 9/173 310/346 |
| 2015/0207490 A1* | 7/2015 | Taniguchi ............. H03H 9/568 333/133 |
| 2016/0164489 A1* | 6/2016 | Shin ....................... H03H 9/173 333/189 |
| 2018/0062608 A1 | 3/2018 | Lee et al. |

FOREIGN PATENT DOCUMENTS

| | | |
|---|---|---|
| KR | 10-2007-0102519 A | 10/2007 |
| KR | 10-1358674 B1 | 2/2014 |
| KR | 10-2018-0023787 A | 3/2018 |

OTHER PUBLICATIONS

Korean Office Action dated May 17, 2019 in counterpart Korean Patent Application No. 10-2018-0056701 (3 pages in English and 4 pages in Korean).

* cited by examiner

BULK ACOUSTIC WAVE RESONATOR AND METHOD OF MANUFACTURING THE SAME

CROSS-REFERENCE TO RELATED APPLICATIONS

This application claims the benefit under 35 U.S.C. s119(a) of Korean Patent Application No. 10-2018-0056701 filed on May 17, 2018 in the Korean Intellectual Property Office, the entire disclosure of which is incorporated herein by reference for all purposes.

BACKGROUND

1. Field

The following description relates to a bulk acoustic wave resonator and a method of manufacturing a bulk acoustic wave resonator.

2. Description of Related Art

With the recent rapid development of mobile communications devices, chemical and biological devices, and the like, there is increasing demand for a compact and lightweight filter, an oscillator, a resonant element, an acoustic resonant mass sensor, and the like, which are used in mobile communications devices. A thin film bulk acoustic resonator is a means for implementing such a compact and lightweight filter, an oscillator, a resonant element, an acoustic resonance mass sensor, and the like.

In general, a thin film bulk acoustic resonator includes a resonant portion formed by sequentially laminating a first electrode, a piezoelectric layer, and a second electrode on a substrate.

In order for such a resonant portion to operate smoothly, the upper and lower portions of the resonant portion should be floated in the air such that the upper and lower portions are not restricted. To this end, a sacrificial layer is deposited in the early stage of manufacturing the resonator. When the resonator is formed, the sacrificial layer is removed by a halide-based etching gas such as xenon difluoride ($XeF_2$) to float the resonant portion.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a method of manufacturing a bulk acoustic wave resonator includes: forming a sacrificial layer on a substrate protection layer; forming a membrane layer on the substrate protection layer to cover the sacrificial layer; and forming a cavity by removing the sacrificial layer using a gas mixture comprising a halide-based gas and an oxygen-containing gas, wherein a mixture ratio of the halide-based gas to the oxygen-containing gas in the gas mixture is in a range of 1.5 to 2.4.

The sacrificial layer may include polysilicon.

The halide-based gas may be xenon difluoride ($XeF_2$).

The membrane layer may have a thickness variation less than or equal to 170 angstroms after the forming of the cavity.

The substrate protection layer may have a thickness variation less than or equal to 170 angstroms after the forming of the cavity.

The method may further include: forming the gas mixture by mixing the oxygen-containing gas and the halide-based gas in a gas mixture supply pipe; and supplying the gas mixture to a process chamber from the gas mixture supply pipe, wherein the removing of the sacrificial layer is performed in the process chamber.

The method may further include: forming the gas mixture by mixing the oxygen-containing gas and the halide-based gas in a process chamber, wherein the removing of the sacrificial layer is performed in the process chamber.

The method may further include: forming the gas mixture by mixing the oxygen-containing gas and the halide-based gas in a gas mixture storage; and supplying the gas mixture to a process chamber from the gas mixture storage, wherein the removing of the sacrificial layer is performed in the process chamber.

In another general aspect, a bulk acoustic wave resonator includes: a substrate; a substrate protection layer disposed on a top surface of the substrate; a membrane layer forming a cavity together with the substrate; a resonance part disposed on the membrane layer; and an inlet configured to connect the cavity to an external component, wherein either one or both of a thickness of the membrane layer and a thickness of the substrate protection layer increases as a distance from the inlet increases.

The sacrificial layer may include polysilicon.

The resonance part may include a bottom electrode disposed on the membrane layer, a piezoelectric layer disposed to cover at least a portion of the bottom electrode, and a top electrode disposed to cover at least a portion of the piezoelectric layer. The bottom electrode and the top electrode may be formed of molybdenum or a molybdenum-containing alloy.

The resonance part may include a bottom electrode disposed on the membrane layer, a piezoelectric layer disposed to cover at least a portion of the bottom electrode, and a top electrode disposed to cover at least a portion of the piezoelectric layer. The bulk acoustic wave resonator may further include an insertion layer disposed below a portion of the piezoelectric layer.

The substrate protection layer may have a thickness variation of 170 angstroms or less.

The membrane layer may have a thickness variation of 170 angstroms or less.

The substrate protection layer may include silicon oxide or silicon nitride.

The membrane layer may include silicon oxide or silicon nitride.

A ratio of half a width of an active region of the bulk acoustic wave resonator to either one or both of a thickness variation of the substrate protection layer and a thickness variation of the membrane layer may be greater than 0.0150 and less than 0.0200.

The thickness of the substrate protection layer in an active region of the bulk acoustic wave resonator may be in a range of 10,000 angstroms to 9,830 angstroms. The thickness of the membrane layer in the active region may be in a range of 500 angstroms to 330 angstroms.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
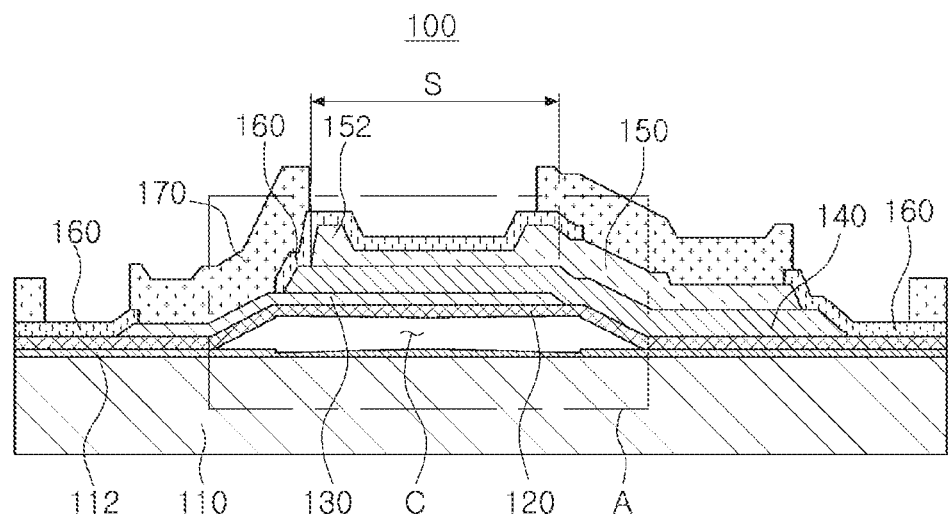
FIG. 1 is a cross-sectional view of a bulk acoustic wave resonator, according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 2:
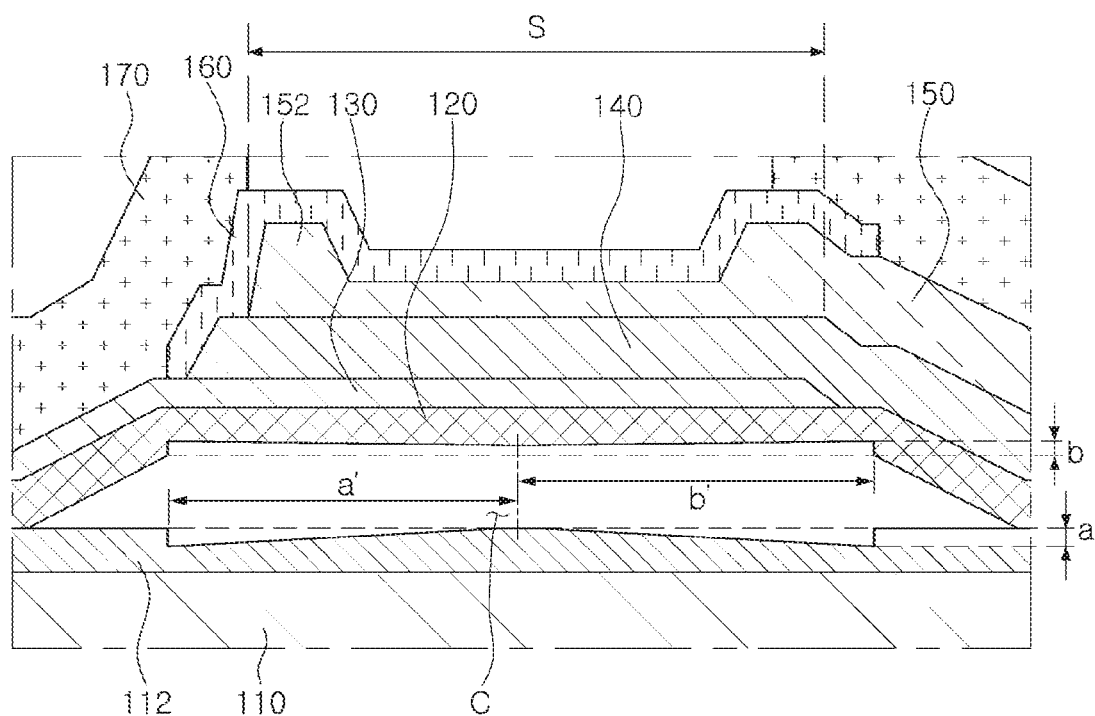
FIG. 2 is an enlarged view of a portion 'A' in FIG. 1.
Figure 3:
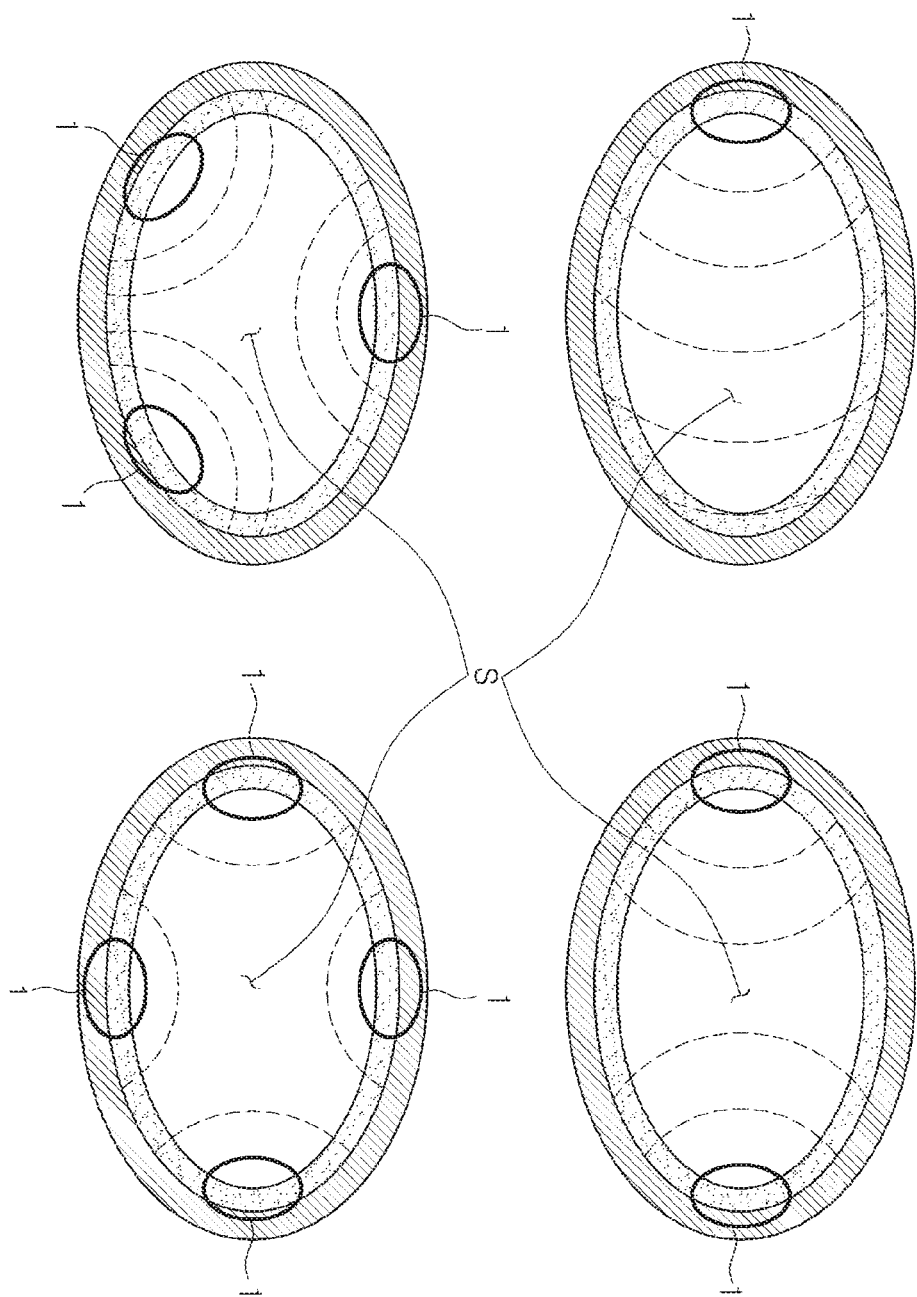
FIG. 3 illustrates a position and a thickness variation of an inlet formed in the bulk acoustic wave resonator of FIG. 1.

FIG. 1 is a cross-sectional view of a bulk acoustic wave resonator 100, according to an example. FIG. 2 is an enlarged view of a portion 'A' in FIG. 1. FIG. 3 illustrates a position and a thickness variation of an inlet 1 formed in the bulk acoustic wave resonator 100.

Referring to FIGS. 1 and 2, the bulk acoustic wave resonator 100 may include a substrate 110, a membrane layer 120, a bottom electrode 130, a piezoelectric layer 140, a top electrode 150, a passivation layer 160, and a metal pad 170.

The substrate 110 may be a silicon-laminated substrate. For example, a silicon waver may be used as the substrate 110. The substrate 110 may be provided with a substrate protection layer 112 disposed thereon to face a cavity C.

The substrate protection layer 112 protects the substrate 110 disposed below the substrate protection layer 112 from damage during formation of the cavity C.

The substrate protection layer 112 may be formed of any one or any combination of any two or more of silicon dioxide ($SiO_2$), silicon nitride ($Si_3N_4$), aluminum oxide ($Al_2O_3$), and aluminum nitride (AlN), and may be formed through any one of chemical vapor deposition, RF magnetron sputtering, and evaporation.

Figure 16:
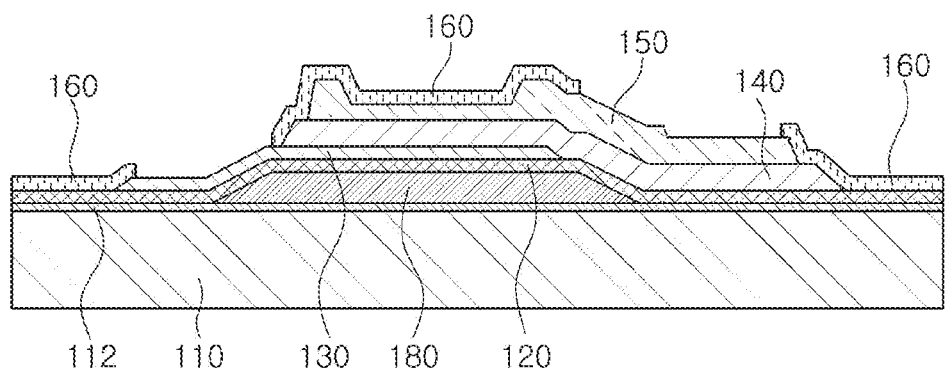

The substrate protection layer 112 and the membrane layer 120 may be somewhat etched during a process of removing a sacrificial layer 180 (see FIG. 16) which will be described later. Thickness variations (a and b) of the substrate protection layer 112 and the membrane layer 120 may be 170 angstroms (Å) or less.

As an example, a thickness of the substrate protection layer 112 in an active region S may be in a range of 10,000 to 9,830 Å and a thickness of the membrane layer 120 in the active region S may be in a range of 500 to 330 Å.

For example, the sacrificial layer 180 is removed using an etching gas including a gas mixture of an oxygen-containing gas and a halide-based gas. As shown in FIG. 3, an etching process performed using the gas mixture starts from an inlet 1 of an etching gas. Thus, an etching rate at the membrane layer 120 and the substrate protection layer 112 in a portion of the active region S disposed adjacent to the inlet 1 may be higher than an etching rate at the membrane layer 120 and the substrate protection layer 112 in a portion of the active region S disposed farthest away from the inlet 1.

The term "active region S" refers to a region in which the bottom electrode 130, the piezoelectric layer 140, and the top electrode 150 are all laminated/stacked.

Additionally, a "resonance part" is a structure configured to generate vibrations, and includes the bottom electrode 130, the piezoelectric layer 140, and the top electrode 150. The term "thickness variation" refers to a thickness difference, or variation in thickness, of a layer etched by an etching gas in the active region S. In FIG. 2, "a" is a thickness variation of the substrate protection layer 112 caused by an etch and "b" is a thickness variation of the membrane layer 120 caused by an etch.

The inlet 1 shown in FIG. 3 may be formed in the bulk acoustic wave resonator 100 to be disposed outward of the active region S.

In FIG. 2, a first length ratio (a/a') may be greater than a second length ratio (b/b') (a' and b' each being half a width of the active region S). In detail, an etching rate established during removal of the sacrificial layer 180 may be lower in the membrane layer 120 than in the substrate protection layer 112. However, the disclosure herein is not limited to such an example.

The membrane layer 120 forms the cavity C together with the substrate 110. In the process of manufacturing the bulk acoustic wave resonator 100, the membrane layer 120 is formed on the sacrificial layer 180 (see FIG. 16) and forms the cavity C, together with the substrate protection layer 112, by the removal of the sacrificial layer 180.

As an example, the membrane layer 120 is formed of a dielectric layer including one of silicon nitride (SiN), silicon oxide ($SiO_2$), manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO).

Similarly to the substrate protection layer 112, the membrane layer 120 may also be etched during removal of the sacrificial layer 180. Also, a thickness variation of the membrane layer 120 during removal of the sacrificial layer 180 may be 170 Å or less.

By using the gas mixture of an oxygen-containing gas and a halide-based gas as an etching gas during removal of the sacrificial layer 180, the thickness variations (a and b) of the substrate protection layer 112 and the membrane layer 120 may be less than or equal to 170 Å.

A second length ratio b/b' shown in FIG. 2 may be more than about 0.0150 and less than 0.0200.

As an example, the second length ration b/b' shown in FIG. 2 may be 0.0176.

Hereinafter, experimental data indicating a thickness variation of the substrate protection layer 112 and the membrane layer 120 depending on a mixture ratio of an oxygen-containing gas and a halide-based gas will be described below.

As an example, xenon difluoride ($XeF_2$) was used as the halide-based gas. Experiments were performed while changing only the mixture ratio of an oxygen-containing gas and a halide-based gas and were performed under the same conditions such as a process time, a temperature, a pressure, and the like.

In addition, the experimental data indicates the mixture ratio of an oxygen-containing gas and a halide-based gas [molarity of the halide-based gas/molarity of the oxygen-containing gas].

When only the xenon difluoride ($XeF_2$) was used as an etching gas to remove the sacrificial layer 180, a thickness variation of the substrate protection layer 112 and the membrane layer 120 was 245 Å.

TABLE (1)

| $XeF_2/O_2$ | Thickness Variation (Å) |
|---|---|
| 1.5 | 50 |
| 1.7 | 67 |
| 1.9 | 90 |
| 2.2 | 127 |
| 2.4 | 165 |
| 2.6 | 213 |
| only $XeF_2$ | 245 |

However, as can be seen from the experimental data, the thickness variations (a and b) of the substrate protection layer 112 and the membrane layer 120 may be adjusted by adjusting an amount of the oxygen-containing gas mixed with the xenon difluoride ($XeF_2$).

As indicated in Table 1, the mixture ratio ($XeF_2/O_2$) of the xenon difluoride ($XeF_2$) and the oxygen-containing gas may have a range of 1.5 to 2.4 such that the thickness variations (a and b) of the substrate protection layer 112 and the membrane layer 120 are less than or equal to 170 Å.

Figure 4:
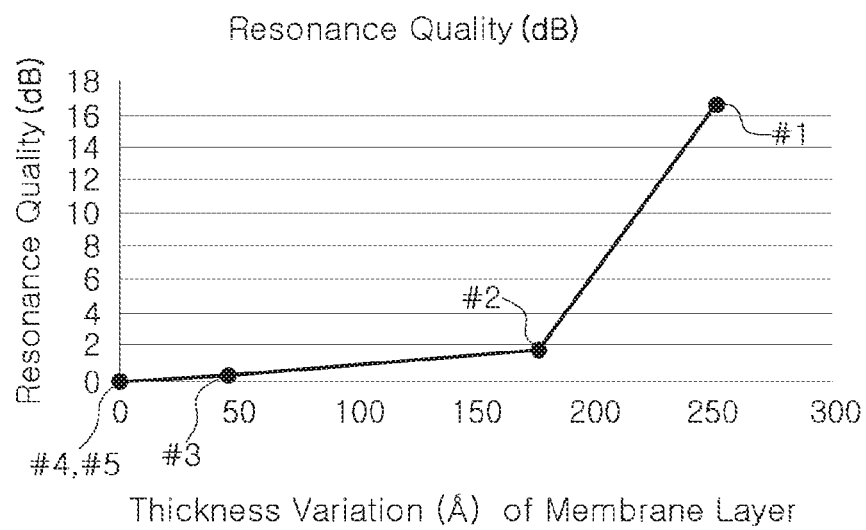
FIG. 4 is a graph illustrating a resonance quality effect of the bulk acoustic resonator of FIG. 1.

As shown in FIG. 4, when the thickness variation was less than or equal to 170 Å (for example, period between #5 and #2), resonance quality (dB) increased gradually. When the thickness variation was greater than 170 Å (for example, period between #2 and #1), the resonance quality (dB) increased rapidly. As shown in FIG. 4, in the period in which the thickness variation is more than 170 Å, a resonance quality value is rapidly increased to decrease a quality of the bulk acoustic wave resonator 100.

Figure 5:
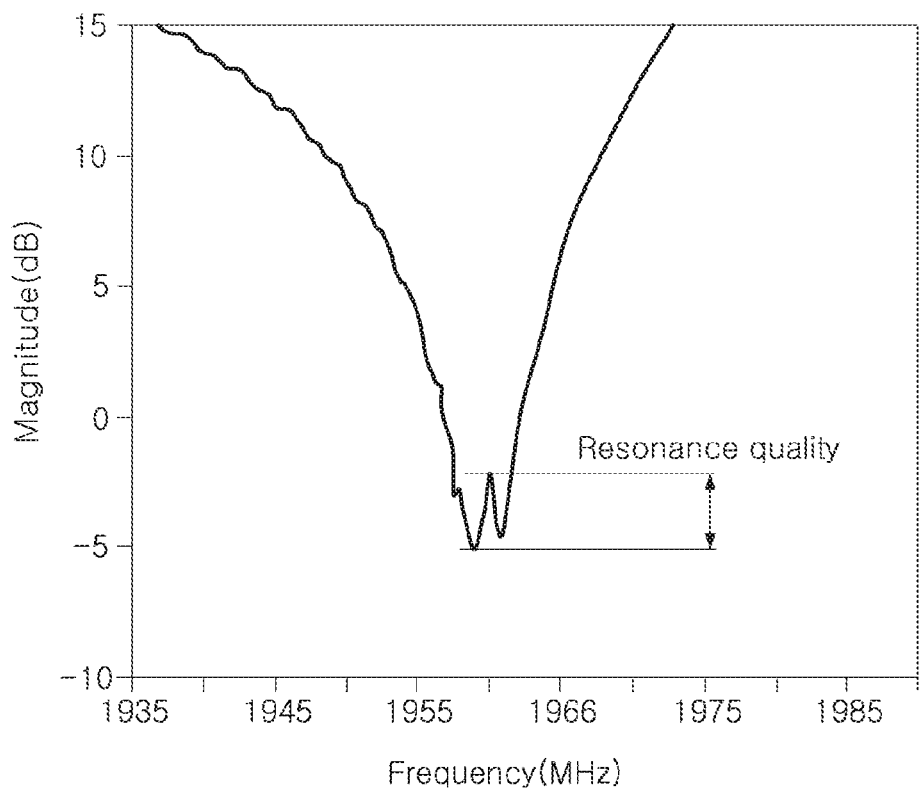
FIG. 5 is a graph illustrating resonance quality when only a halide-based gas is used as an etching gas, according to an example.
Figure 6:
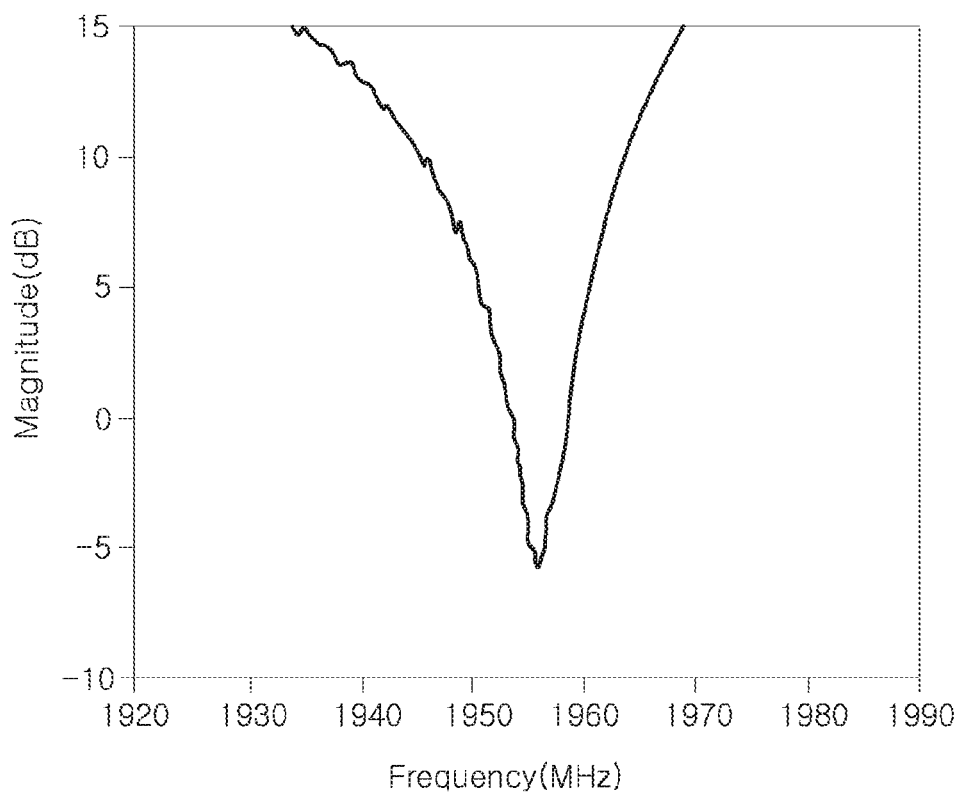
FIG. 6 is a graph illustrating resonance quality when a gas mixture of a halide-based gas and an oxygen-containing gas is used as an etching gas, according to an example.

As shown in FIGS. 5 and 6, the resonance quality was greater when only the xenon difluoride ($XeF_2$) was used as an etching gas than when the gas mixture of an oxygen-containing gas and a halide-based gas was used as an etching gas.

The term "resonance quality (dB)" refers to a difference between a minimum and a maximum of at least one inflection point. As the resonance quality value increases, the quality of the bulk acoustic wave resonator 100 is decreased.

Figure 7:
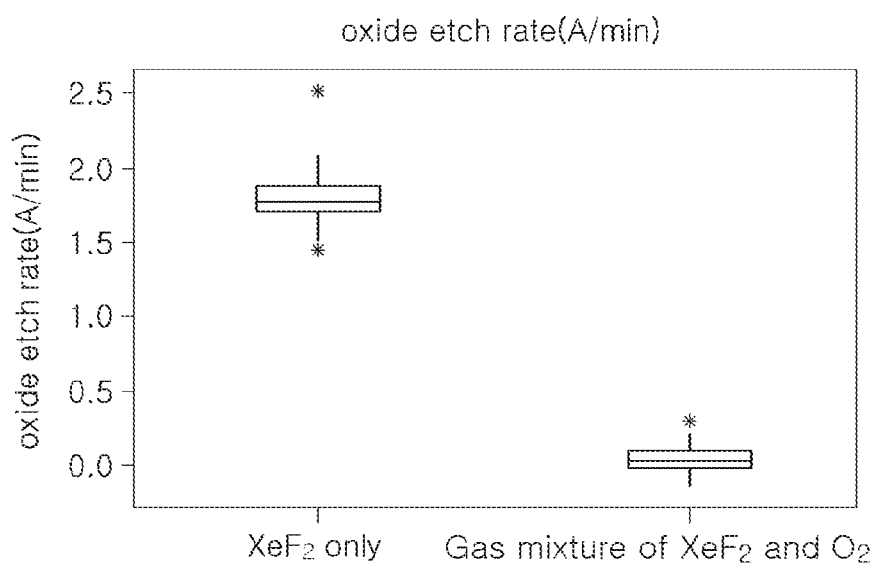
FIG. 7 is a graph illustrating an oxide etching rate when only a halide-based gas is used as an etching gas and, an oxide etching rate when a gas mixture of a halide-based gas and an oxygen-containing gas is used as an etching gas.

In the case in which the substrate protection layer 112 and the membrane layer 120 include oxide, etching rates when only a halide-based gas is used as an etching gas and when a gas mixture of a halide-based gas and an oxygen-containing gas is used as an etching gas are shown in FIG. 7.

As shown in FIG. 7, when only a halide-based gas was used as an etching gas (a conventional technique), an etching rate was 1.81 Å/min on average. When a gas mixture of a halide-based gas and an oxygen-containing gas was used as an etching gas, an etching rate was 0.03 Å/min on average. In the case in which the substrate protection layer 112 and the membrane layer 120 were formed of an oxide-containing material, the etching rate when only a halide-based gas was used as an etching gas decreased by one fifty-eighth (1/58), as compared with the etching rate when only a halide-based gas was used as an etching gas.

As an etching rate of an oxide contained in the substrate protection layer 112 and the membrane layer 120 is reduced, a thickness variation caused by etching of the substrate protection layer 112 and the membrane layer 120 may be reduced, compared with a conventional technique.

Figure 8:
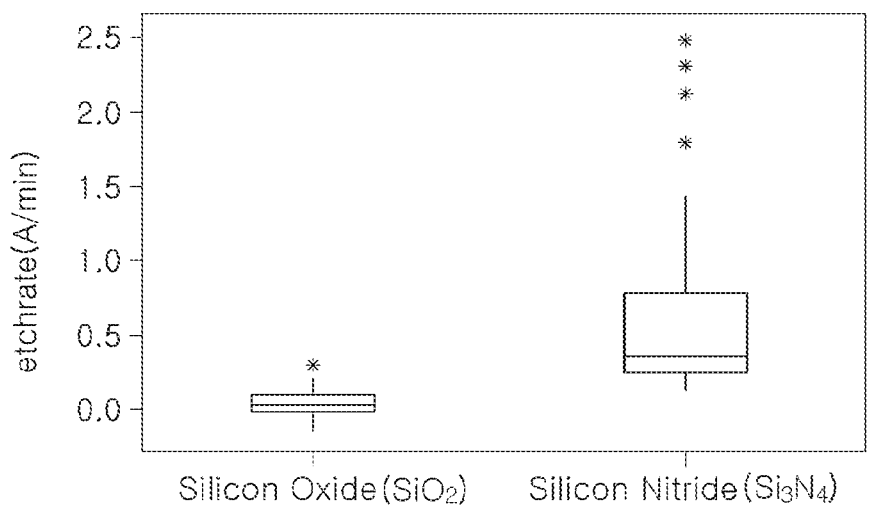
FIG. 8 is a graph illustrating a silicon oxide etching rate and a silicon nitride etching rate when a gas mixture of a halide-based gas and an oxygen-containing gas is used as an etching gas.

As shown in FIG. 8, when the substrate protection layer 112 and the membrane layer 120 were formed of a nitride-containing material, an etching rate of the nitride was 0.48 Å/min on average. An etching rate in the case in which the substrate protection layer 112 and the membrane layer 120 were formed of an oxide-containing material was reduced by one sixteenth (1/16), compared to the case in which the substrate protection layer 112 and the membrane layer 120 were formed of a nitride-containing material.

As such, an etching rate is lower in the case of the substrate protection layer 112 and the membrane layer 120 containing an oxide than in the case of the substrate protection layer 112 and the membrane layer 120 containing nitride.

Accordingly, the thickness variation caused by etching may be further reduced in the case of the substrate protection layer 112 and the membrane layer 120 containing an oxide.

Referring to FIGS. 1 and 2, the bottom electrode 130 is disposed on the membrane layer 120. More specifically, the bottom electrode 130 is disposed on the membrane layer 120 in such a manner that a portion of the bottom electrode 130 is disposed over the cavity C.

As an example, the bottom electrode 130 may be formed of a conductive material such as molybdenum (Mo), ruthenium (Ru), tungsten (W), iridium (Ir), platinum (Pt), or the like, or alloys thereof.

The bottom electrode 130 may be used as either an input electrode or an output electrode configured to receive or provide an electrical signal such as a radio-frequency (RF) signal, or the like. For example, the top electrode 150 may be used as an output electrode when the bottom electrode 130 is used as an input electrode, and the top electrode 150 may be used as an input electrode when the bottom electrode 130 is used as an output electrode.

Still referring to FIGS. 1 and 2, the piezoelectric layer 140 is formed to cover at least a portion of the lower electrode 130. The piezoelectric layer 140 converts a signal input through the bottom electrode 130 or the top electrode 150 into acoustic waves. For example, the piezoelectric layer 140 converts an electrical signal into acoustic waves by physical vibrations.

As an example, the piezoelectric layer 140 may be formed by depositing aluminum nitride, doped aluminum nitride, zinc oxide, or lead zirconate titanate (PZT).

When the piezoelectric layer 140 includes aluminum nitride (AlN), the AlN piezoelectric layer 140 may further include a rare earth metal. As an example, the AlN piezoelectric layer 140 may include any one or any combination of any two or more of scandium (Sc), erbium (Er), yttrium (Y), and lanthanum (La). In addition, when the piezoelectric layer 140 includes aluminum nitride (AlN), the AlN piezoelectric layer 140 may further include a transition metal. As an example, the AlN piezoelectric layer 140 may include any one or any combination of any two or more of zirconium (Zr), titanium (Ti), magnesium (Mg), and hafnium (Hf).

As shown in FIGS. 1 and 2, the top electrode 150 is disposed to cover the piezoelectric layer 140. Similarly to the bottom electrode 130, the top electrode may be formed of a conductive material such as molybdenum (Mo), ruthenium (Ru), tungsten (W), iridium (Ir), platinum (Pt), or the like, or alloys thereof.

The top electrode 150 may be include a frame portion 152. The frame portion 152 is a portion of the top electrode 150 having a thickness greater than a thickness of the remainder of the top electrode 150. The frame portion 152 is provided on the top electrode 150 to be disposed in a region of the active region S except for a center portion of the active region S. For example, the frame portion at least partially surrounds or is disposed around the center portion of the active region S.

The frame portion 152 reflects a lateral wave generated during resonance to an inside of the active region S to confine resonance energy to the active region S. For example, the frame portion 152 is disposed at an edge of the active region S to prevent a vibrations from propagating outwardly from the active region S.

The passivation layer 160 is provided in a region except for portions of the bottom electrode 130 and the top electrode 150. The passivation layer 160 prevents the top electrode 150 and the bottom electrode 130 from being damaged during a manufacturing process.

A thickness of the passivation layer 160 may be adjusted by etching to adjust a frequency in a final process. The passivation layer 160 may be formed of the same material as the membrane layer 120. For example, the passivation layer 160 may be formed of a dielectric layer including any one of manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO).

The metal pad 170 is disposed on portions of the bottom and top electrodes 130 and 150, on which the passivation layer 160 is not formed. As an example, the metal pad 170 may be formed of a material such as gold (Au), a gold-tin (Au—Sn) alloy, copper (Cu), a copper-tin (Cu—Sn) alloy, aluminum (Al), an aluminum alloy, and the like. For example, the aluminum alloy may be an aluminum-germanium (Al—Ge) alloy.

As described above, a mixture ratio of the oxygen-containing gas and the halide-based gas may be adjusted to adjust thickness variations (a and b) of the substrate protection layer 112 and the membrane layer 120. Thus, the resonance quality may be reduced.

Although the foregoing example has been described with respect to the case of a gas mixture of only halide-based gas and oxygen-containing gas, the disclosure is not limited to this example.

For example, a gas mixture of a halide-based gas, an oxygen-containing gas, and an inert gas (e.g., helium (He), argon (Ar), or the like) may be used as an etching gas. Even in the case of such a mixture, the mixture ratio of the halide-based gas to the oxygen-containing gas may be in a range of 1.5 to 2.4.

In addition, a gas mixture of a halide-based gas and an oxygen-containing gas (e.g., carbon dioxide, nitrogen dioxide, or the like) may also be used as an etching gas. Even in the case of such a mixture, the mixture ratio of the halide-based gas to an oxygen-containing gas extracted from the oxygen-containing gas may be in a range of 1.5 to 2.4.

Hereinafter, a method of manufacturing the bulk acoustic wave resonator 100 will be described with reference to FIGS. 9 to 18.

FIGS. 9 to 18 illustrate a method of manufacturing the bulk acoustic wave resonator 100, according to an example.

Figure 9:
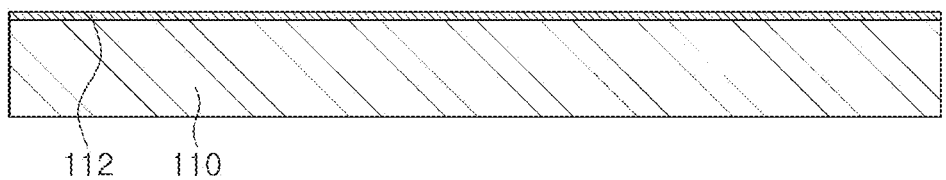
FIGS. 9 to 18 illustrate methods of manufacturing a bulk acoustic wave resonator, according to examples.

As shown in FIG. 9, a substrate protection layer 112 is formed on a substrate 110. As an example, the substrate protection layer 112 is formed of a material including silicon nitride ($Si_3N_4$) or silicon oxide ($SiO_2$).

Figure 10:
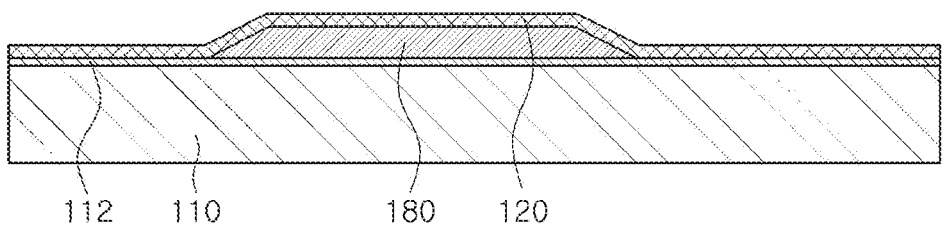

As shown in FIG. 10, a sacrificial layer 180 is formed on the substrate protection layer 112. For example, the sacrificial layer 180 is formed of a silicon-based material (e.g., a polysilicon-containing material). Then, an unnecessary portion of the sacrificial layer 180 is removed by a gas mixture of an oxygen-containing gas and a halide-based etching gas such as fluorine (F), chlorine (Cl), or the like.

Figure 18:
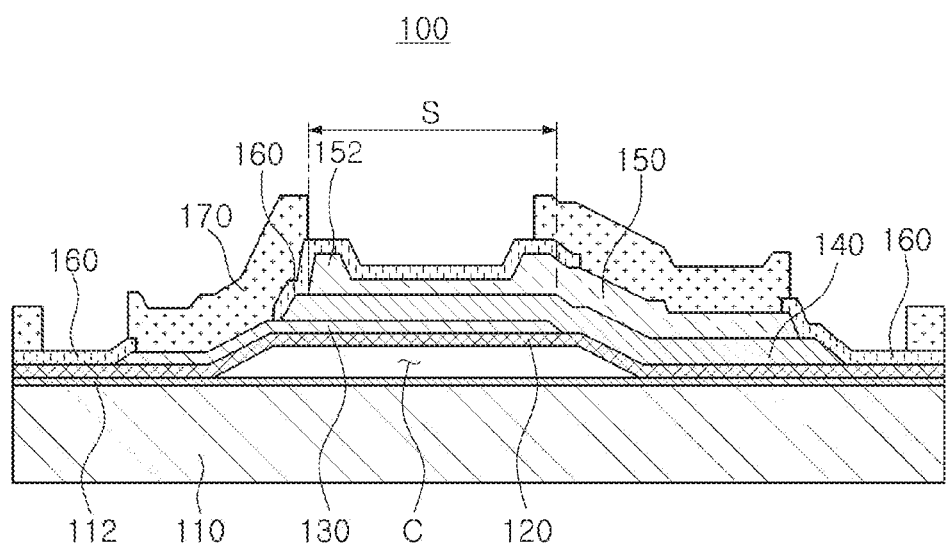

A membrane layer 120 may be formed to cover the sacrificial layer 180. Ultimately, as shown in FIG. 18, the membrane layer 120 forms the cavity C by removal of the sacrificial layer 180.

Figure 11:
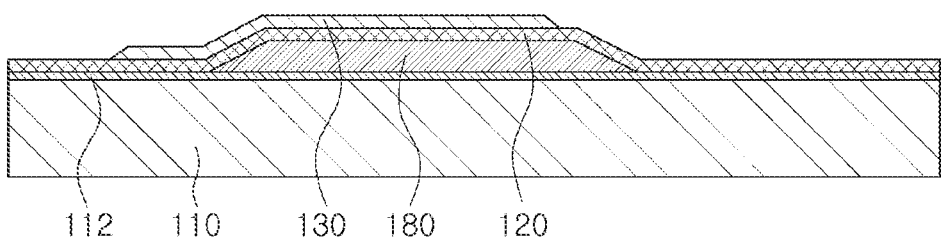

As shown in FIG. 11, a bottom electrode 130 is formed on the membrane layer 120. A portion of the bottom electrode 130 is disposed on the sacrificial layer 180, and another portion of the bottom electrode 130 is formed to protrude outwardly of the sacrificial layer 180.

As an example, the bottom electrode 130 is formed using a conductive material such as molybdenum (Mo), ruthenium (Ru), tungsten (W), iridium (Ir), platinum (Pt), or the like, or alloys thereof.

Figure 12:
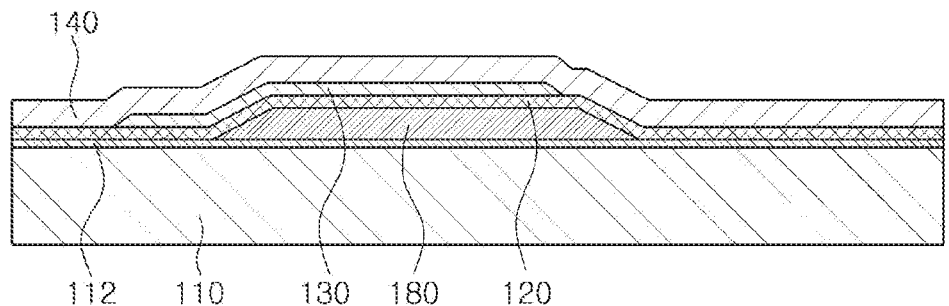

As shown in FIG. 12, a piezoelectric layer 140 is formed to cover the lower electrode 130. The piezoelectric layer 140 may be formed by depositing aluminum nitride, doped aluminum nitride, zinc oxide or lead zirconate titanate (PZT).

Figure 13:
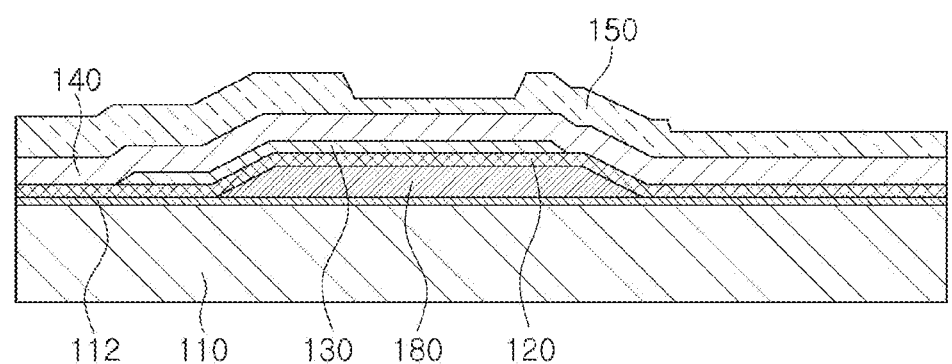

As shown in FIG. 13, a top electrode 150 is disposed to cover the piezoelectric layer 140. Similarly to the bottom electrode 130, the top electrode 150 may be formed of a conductive material such as molybdenum (Mo), ruthenium (Ru), tungsten (W), iridium (Ir), platinum (Pt), or the like, or alloys thereof.

Figure 14:
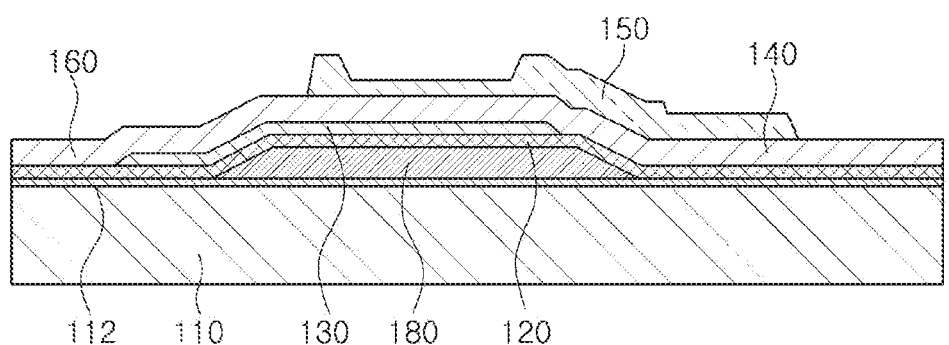

As shown in FIG. 14, a portion of the top electrode 150 is removed by dry etching.

Subsequently, as illustrated in FIG. 9, an edge portion of the piezoelectric layer 140 is removed by etching. Thus, a portion of the lower electrode 130 disposed below the piezoelectric layer 140 is externally exposed.

Figure 15:
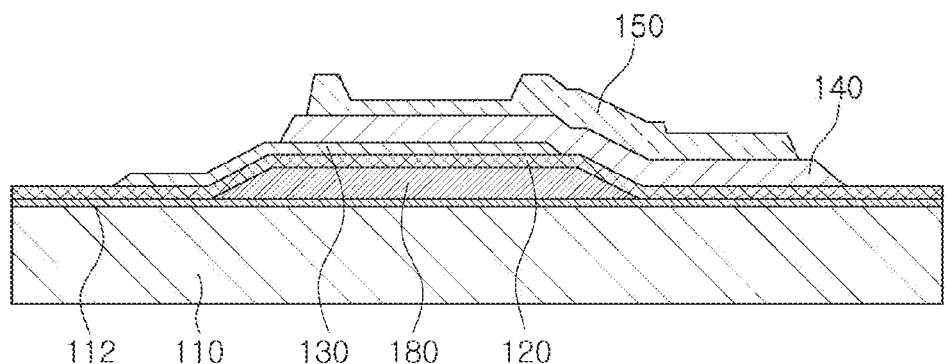

As shown in FIG. 15, an edge portion of the piezoelectric layer 140 is removed by etching. Thus, a portion of the bottom electrode 130 disposed below the piezoelectric layer 140 is exposed outwardly.

As shown FIG. 15, a passivation layer 160 is formed on a portion of the top electrode 150 and the outwardly exposed portion of the bottom electrode 130. When the passivation layer 160 is formed, the passivation layer 160 is formed in such a manner that a portion of the top electrode 150 and a portion of the bottom electrode 130 are exposed outwardly.

Figure 17:
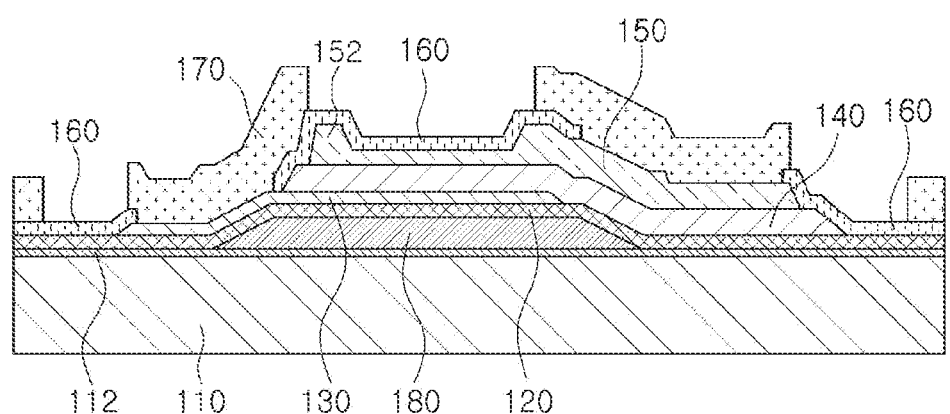

As shown in FIG. 17, a metal pad 170 is formed to be connected to the outwardly exposed portions of the bottom electrode 130 and the top electrode 150. The metal pad 170 may be formed of a material such as gold (Au), a gold-tin (Au—Sn) alloy, or the like.

As shown in FIG. 18, the sacrificial layer 180 is removed to form the cavity C below the membrane layer 120. When the sacrificial layer 180 is removed, a gas mixture of an oxygen-containing gas and a halide-based gas is used as an etching gas. Accordingly, thickness variations (a and b) of the substrate protection layer 112 and the membrane layer 120 may be less than or equal to 170 Å.

Referring to the experimental data in Table (1), xenon difluoride ($XeF_2$) may be used as the halide-based gas. In the case in which only the xenon difluoride ($XeF_2$) is used an etching gas to remove the sacrificial layer 180, the thickness variations (a and b) of the substrate protection layer 112 and the membrane layer 120 may be less than or equal to 245 Å.

However, as can be seen from the experimental data in Table (1), the thickness variations (a and b) of the substrate protection layer 112 and the membrane layer 120 may be adjusted by adjusting an amount of the oxygen-containing gas mixed with the xenon difluoride ($XeF_2$).

The mixture ratio ($XeF_2/O_2$) of the xenon difluoride ($XeF_2$) and the oxygen-containing gas may have a range of 1.5 to 2.4 such that the thickness variations (a and b) of the substrate protection layer 112 and the membrane layer 120 are less than or equal to 170 Å.

As shown in FIG. 4, when the thickness variation is more than 170 Å, a resonance quality (dB) increases rapidly. As shown in FIG. 4, in the case in which the thickness variation is increased, a resonance quality value is increased, thereby decreasing a quality of the bulk acoustic wave resonator 100.

As shown in FIGS. 5 and 6, the resonance quality is greater when only the xenon difluoride ($XeF_2$) is used as an etching gas than when the gas mixture of an oxygen-containing gas and a halide-based gas is used as an etching gas.

As shown in FIG. 7, when only a halide-based gas is used as an etching gas (which is a conventional technique), an etching rate may be 1.81 Å/min on average. When a gas mixture of a halide-based gas and an oxygen-containing gas is used as an etching gas, an etching rate may be 0.3 Å/min on average. In the case in which the substrate protection layer 112 and the membrane layer 120 are formed of an oxide-containing material, the etching rate when only a halide-based gas is used as an etching gas may decrease by one fifty-eighth (⅛8), as compared with the etching rate when only a halide-based gas is used as an etching gas.

As an etching rate of an oxide contained in the substrate protection layer 112 and the membrane layer 120 is reduced, a thickness variation caused by etching of the substrate protection layer 112 and the membrane layer 120 may be reduced, compared with a conventional technique.

As shown in FIG. 8, when the substrate protection layer 112 and the membrane layer 120 are formed of a nitride-containing material, an etching rate of the nitride may be 0.48 Å/min on average. An etching rate in the case in which the substrate protection layer 112 and the membrane layer 120 are formed of an oxide-containing material may be reduced by one sixteenth (1/16), compared to the case in which the substrate protection layer 112 and the membrane layer 120 are formed of a nitride-containing material.

As described above, an etching rate is lower in the case of the substrate protection layer 112 and the membrane layer 120 containing an oxide than in the case of the substrate protection layer 112 and the membrane layer 120 containing nitride.

Accordingly, the thickness variation caused by etching may be further reduced in the case of the substrate protection layer 112 and the membrane layer 120 containing an oxide.

Figure 19:
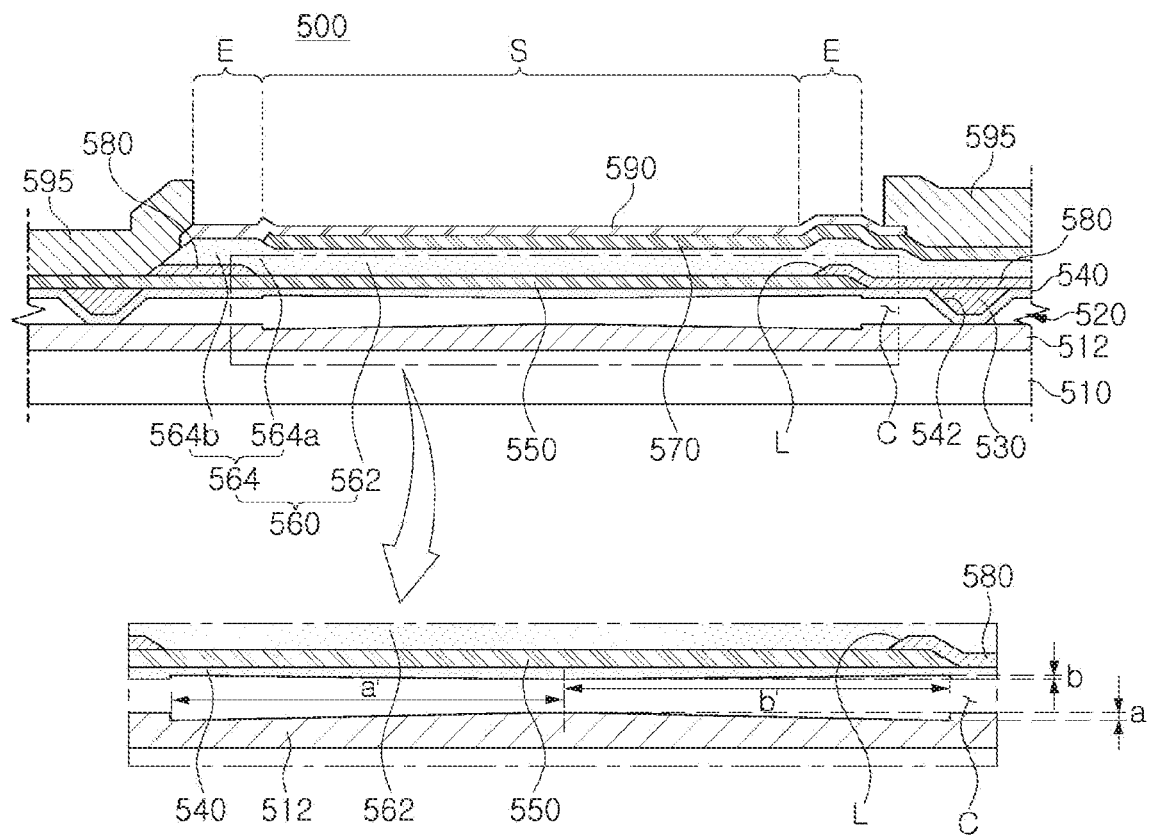
FIG. 19 is a cross-sectional view of a bulk acoustic wave resonator, according to an example.

FIG. 19 is a cross-sectional view of a bulk acoustic wave resonator 500, according to an example.

Referring to FIG. 19, the bulk acoustic wave resonator 500 may include, for example, a substrate 510, a support layer 520, an etch-stop layer 530, a membrane layer 540, a bottom electrode 550, a piezoelectric layer 560, a top electrode 570, an insertion layer 580, a passivation layer 590, and a metal pad 595.

The substrate 510 may be a silicon substrate. For example, a silicon wafer or a silicon-on-insulator (SOI) substrate may be used as the substrate 510.

A substrate protection layer 512 may be formed on a top surface of the substrate 510 to electrically isolate an overlying configuration from the substrate 110. Also the substrate protection layer 512 prevents the substrate 510 from being etched by an etching gas when a cavity C is formed during a manufacturing process.

In this example, the substrate protection layer 512 may be formed of any one or any combination of any two or more of silicon dioxide ($SiO_2$), silicon nitride ($Si_3N_4$), aluminum oxide ($Al_2O_2$), and aluminum nitride (AlN), and may be formed through any one of chemical vapor deposition, RF magnetron sputtering, and evaporation.

The substrate protection layer 512 may be somewhat etched during a process of removing a sacrificial layer (not shown). A thickness variation (a) of the substrate protection layer 512 may be 170 Å or less.

For example, the sacrificial layer is removed using an etching gas including a gas mixture of an oxygen-containing gas and a halide-based gas. An etching rate at the substrate protection layer 112 disposed around an inlet (not shown) of an etching gas may be higher than an etching rate at the substrate protection layer 112 in the center portion of the active region S.

In FIG. 19, a first length ratio (a/a') may be greater than a second length ratio (b/b'). For example, an etching rate established during removal of the sacrificial layer 180 may be lower in the membrane layer 120 than in the substrate protection layer 112. However, the disclosure herein is not limited to such an example.

The term "active region S" refers to a region in which the bottom electrode 550, the piezoelectric layer 560, and the top electrode 570 are all laminated/stacked.

A "resonance part" is a structure configured to generate vibrations, and includes the bottom electrode 550, the piezoelectric layer 560, and the top electrode 570.

Figure 23:
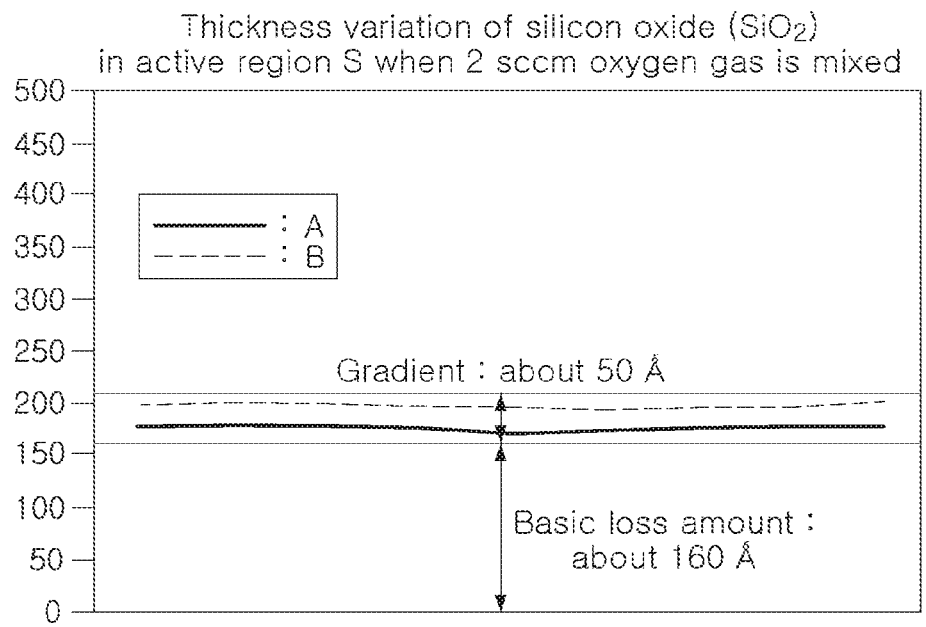

The term "thickness variation" refers to a thickness difference, or variation in thickness, of a layer etched by an etching gas in the active region S. In FIG. 23, "a" is a thickness variation of the substrate protection layer 512 and "b" is a thickness variation of the membrane layer 540. Additionally, a' and b' are each half a width of the active region S.

The support layer 520 may be formed on the substrate protection layer 512, and the cavity C and the etch-stop layer 530 may be disposed inward of the support layer 520. The cavity C is formed by removing a portion of the support layer 520 (for example, the support layer) during a manufacturing process. The cavity C is formed inwardly of the support 520, which may allow the bottom electrode 550, which is disposed above the support layer 520, and the like, to be formed to be flat.

The etch-stop layer 530 is disposed along a boundary of the cavity C. The etch-stop layer 530 prevents etching from proceeding over a cavity region during formation of the cavity C.

The membrane layer 540 forms the cavity C, together with the substrate 510. The etch-stop layer 530 is inserted and disposed in a groove 542 formed by the membrane layer 540. The membrane layer 540 may be formed of a dielectric layer including one of silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide (Al2O3), titanium oxide (TiO2), and zinc oxide (ZnO).

Similarly to the substrate protection layer 512, the membrane layer 520 may also be etched during removal of the sacrificial layer. A thickness variation of the membrane layer 520, which occurs during removal of the sacrificial layer, may be 170 Å or less.

As an example, a thickness of the substrate protection layer 512 in an active region S may be in a range of 10,000 to 9,830 Å, and a thickness of the membrane layer 120 in the active region S may be in a range of 500 to 330 Å.

As described above, when the gas mixture of an oxygen-containing gas and a halide-based gas is used as an etching gas during removal of the sacrificial layer, thickness variations (a and b) of the substrate protection layer 512 and the membrane layer 540 may be less than or equal to 170 Å.

A second length ratio b/b' shown in FIG. 19 may be more than about 0.0150 and less than 0.0200.

As an example, the second length ration b/b' shown in FIG. 19 may be 0.0176.

As can be seen from Table (1), the thickness variations (a and b) of the substrate protection layer 512 and the membrane layer 540 may be adjusted by adjusting an amount of the oxygen-containing gas mixed with the xenon difluoride ($XeF_2$).

The mixture ratio ($XeF_2/O_2$) of the xenon difluoride ($XeF_2$) and the oxygen-containing gas may have a range of 1.5 to 2.4 such that the thickness variations (a and b) of the substrate protection layer 512 and the membrane layer 540 are less than or equal to 170 Å.

As shown in FIG. 4, when the thickness variation is less than or equal to 170 Å, resonance quality (dB) increases gradually. When the thickness variation is increased, a resonance quality value is increased, thereby decreasing a quality of the bulk acoustic wave resonator 500.

As shown in FIGS. 5 and 6, the resonance quality is greater when only the xenon difluoride ($XeF_2$) is used as an etching gas than when the gas mixture of an oxygen-containing gas and a halide-based gas is used as an etching gas.

As can be seen from Table (1), in the case in which the gas mixture of an oxygen-containing gas and a halide-based gas is used as an etching gas, a mixture ratio of the oxygen-containing gas and the halide-based gas may be adjusted to change an etching rate of polysilicon. Thus, the thickness variations (a and b) of the substrate protection layer 512 and the membrane layer 540 may be adjusted.

The polysilicon is a material used as a sacrificial layer. The etching rate of polysilicon refers to a lateral etching rate of the polysilicon etched gradually from the inlet 1 shown in FIG. 3 to a position farthest from the inlet 1.

As shown in FIG. 7, when only a halide-based gas is used as an etching gas (which is a conventional technique), an etching rate may be 1.81 Å/min on average. When a gas mixture of a halide-based gas and an oxygen-containing gas is used as an etching gas, an etching rate may be 0.03 Å/min on average. In the case in which the substrate protection layer 512 and the membrane layer 540 are formed of an oxide-containing material, the etching rate when only a halide-based gas is used as an etching gas may decrease by one fifty-eighth (1/58), as compared with the etching rate when only a halide-based gas is used as an etching gas.

As an etching rate of an oxide contained in the substrate protection layer 512 and the membrane layer 540 is reduced, a thickness variation caused by etching of the substrate protection layer 112 and the membrane layer 120 may be reduced, as compared with a conventional technique.

As shown in FIG. 8, when the substrate protection layer 512 and the membrane layer 540 are formed of a nitride-containing material, an etching rate of the nitride may be 0.48 Å/min on average. An etching rate in the case in which the substrate protection layer 512 and the membrane layer 540 are formed of an oxide-containing material may be reduced by one sixteenth (¹⁄₁₆), compared to the case in which the substrate protection layer 512 and the membrane layer 540 are formed of a nitride-containing material.

As such, an etching rate is lower in the case of the substrate protection layer 512 and the membrane layer 540 containing an oxide than in the case of the substrate protection layer 112 and the membrane layer 120 containing a nitride.

Accordingly, the thickness variation caused by etching may be reduced in the case of the substrate protection layer 512 and the membrane layer 540 containing an oxide.

The bottom electrode 550 is formed on the membrane layer 540, and a portion of the bottom electrode 550 is disposed over the cavity C. The bottom electrode 550 may be used as either an input electrode or an output electrode configured to receive or provide an electrical signal such as a radio-frequency (RF) signal or the like.

Referring to FIG. 19, the piezoelectric layer 560 is formed to cover the bottom electrode 550 disposed above the cavity C. The piezoelectric layer 560 causes a piezoelectric effect to convert electrical energy into mechanical energy in the form of acoustic waves. The piezoelectric layer 560 may be formed of one of aluminum nitride (AlN), zinc oxide (ZnO), and PbZrTiO (PZT). For example, when the piezoelectric 560 includes aluminum nitride (AlN), the piezoelectric layer 560 may further include a rare earth metal. As an example, the rare earth metal may include any one or any combination of any two or more of scandium (Sc), erbium (Er), yttrium (Y), and lanthanum (La). As an example, a transition metal includes any one or any combination of any two or more of titanium (Ti), zirconium (Zr), hafnium (Hf), tantalum (Ta), and niobium (Nb). Additionally, magnesium (Mg), or another divalent metal, may be included.

The piezoelectric layer 560 includes a piezoelectric portion 562 disposed in a flat portion S and a bent portion 564 disposed in an extending portion E.

The piezoelectric portion 562 is directly laminated on a top surface of the bottom electrode 550. Thus, the piezoelectric portion 562 is interposed between the bottom electrode 550 and the top electrode 570 to be flat with the bottom electrode 550 and the top electrode 570.

The bent portion 564 may be defined as a region extending outwardly from the piezoelectric portion 562 to be disposed within the extending portion E.

The bent portion 564 is disposed on an insertion layer 580 which will be described below and is raised following a shape of the insertion layer 580. Accordingly, the piezoelectric layer 560 is bent at a boundary between the piezoelectric portion 562 and the bent portion 564 and the bent portion 564 is raised to correspond to a thickness and a shape of the insertion layer 580.

The bent portion 564 may be divided into an inclined portion 564a and an extension 564b.

The inclined portion 564a is a portion inclined along an inclined surface L of the insertion layer 580. The extension 564b refers to a portion extending outwardly from the inclined portion 564a.

The inclined portion 564a is formed parallel to the inclined surface L of the insertion layer 580, and an incline angle of the inclined surface may be the same as an incline angle of the inclined surface L of the insertion layer 580.

The top electrode 570 is formed to cover at least the piezoelectric layer 560 disposed above the cavity C. The top electrode 570 may be used as either an input electrode or an output electrode configured to receive or provide an electrical signal such as a radio-frequency (RF) signal or the like. For example, the top electrode 570 may be used as an output electrode when the bottom electrode 550 is used as an input electrode, and the top electrode 570 may be used as an input electrode when the bottom electrode 550 is used as an output electrode.

The insertion layer 580 is disposed between the bottom electrode 550 and the piezoelectric layer 560. The insertion layer 580 may be formed of a dielectric material such as silicon oxide ($SiO_2$), aluminum nitride (AlN), aluminum oxide ($Al_2O_3$), silicon nitride ($Si_3N_4$), manganese oxide (MgO), zirconium oxide ($ZrO_2$), lead zirconate titanate (PZT), gallium arsenide (GaAs), hafnium oxide ($HfO_2$), aluminum oxide ($Al_2O_3$), titanium oxide ($TiO_2$), zinc oxide (ZnO), or the like, but is formed of a material different from a material of the piezoelectric layer 160. If necessary, a region including the insertion layer 580 may be formed as an air-filled void, which may be formed by removing the insertion layer 580 during a manufacturing process.

In this example, the insertion layer 580 may be formed to have a thickness equal or similar to a thickness of the bottom electrode 550. The insertion layer 580 may be formed to have a thickness similar to or less than a thickness of the piezoelectric layer 560. For example, the insertion layer 580 may be formed to have a thickness of 100 Å or more and to have a thickness less than the thickness of the piezoelectric layer 560. However, the disclosure is not limited to such a configuration.

The insertion layer 580 is disposed along a surface formed by the membrane layer 540, the bottom electrode 550, and the etch-stop layer 530.

The passivation layer 590 is formed in a region excluding portions of the bottom electrode 550 and the top electrode 570. The passivation layer 590 prevents the top electrode 570 and the bottom electrode 550 from being damaged during a process.

Further, a portion of the passivation layer 570 may be removed by etching to control a frequency during a final process of a manufacturing process. For example, a thickness of the passivation layer 590 may be adjusted. The passivation layer 590 may be formed of a dielectric layer including one of silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO).

The metal pad 595 is formed in a portion of the bottom electrode 550 and the top electrode 570 in which the passivation layer 590 is not formed. As an example, the metal pad 595 may be formed of gold (Au), a gold-tin (Au—Sn) alloy, copper (Cu), a copper-tin (Cu—Sn) alloy, aluminum (Al), an aluminum (Al) alloy, or the like. For example, the aluminum (Al) alloy may be an aluminum-germanium (Al—Ge) alloy.

As described above, the thickness variations (a and b) of the substrate protection layer 512 and the membrane layer 540 may be adjusted by adjusting the mixture ratio of an oxygen-containing gas and a halide-based gas. Thus, the resonance quality may be decreased.

Hereinafter, a manufacturing apparatus of manufacturing a bulk acoustic wave resonator, according to an example, will be described below.

Figure 20:
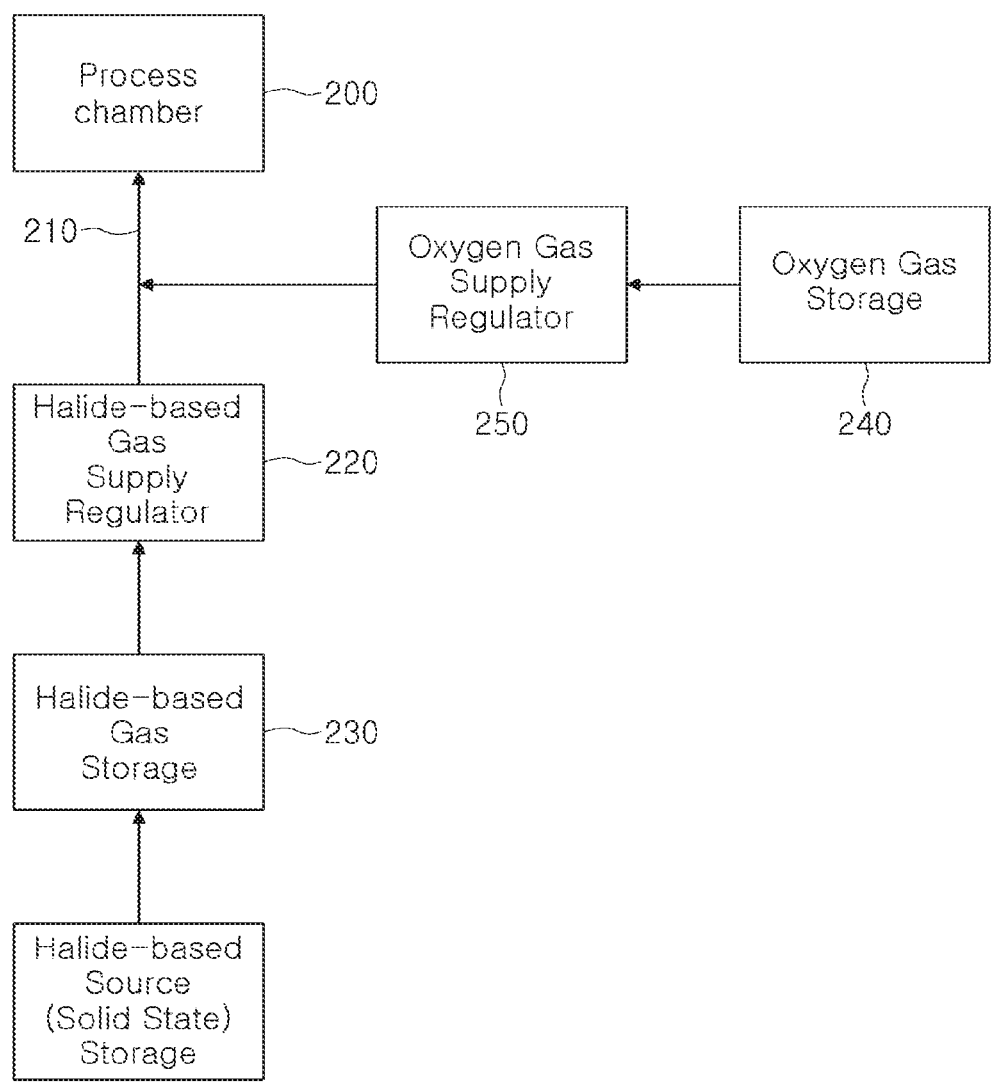
FIG. 20 is a schematic configuration diagram of a manufacturing apparatus used in a method of manufacturing a bulk acoustic wave resonator, according to an example.

FIG. 20 is a schematic configuration diagram of a manufacturing apparatus used in a method of manufacturing a bulk acoustic wave resonator, according to an example. FIGS. 21 to 24 are graphs illustrating the tendency of thickness variations depending on supply of an oxygen-containing gas, respectively.

As shown in FIG. 20, a process chamber 200 for a removal process of the sacrificial layer 180 (see FIG. 17) is provided, and a gas mixture of a halide-based etching gas and an oxygen-containing gas is supplied to the process chamber 200.

The gas mixture may be supplied to the process chamber 200 via a gas mixture supply pipe 210 connected to the process chamber 200.

The halide-based gas (for example, xenon difluoride (XeF2)) is generated through a halide-based gas source stored in a solid state and is supplied to the gas mixture supply pipe 210 by a halide-based gas supply regulator 220 after being stored in the halide-based gas storage 230. The halide-based gas supply regulator 220 may include, for example, one or more valves and/or other components configured to regulate a flow of the halide-based gas. As an example, the halide-based gas may be supplied at supply pressure of 1 to 3 Torr.

The oxygen-containing gas may be stored in an oxygen-containing gas storage 240 and may be supplied to the gas mixture supply pipe 210 via an oxygen-containing gas supply regulator 250. The oxygen-containing gas supply regulator 250 may include, for example, one or more valves and/or other components configured to regulate a flow of the oxygen-containing gas.

Accordingly, the gas mixture of the halide-based gas and the oxygen-containing gas may be supplied to the process chamber 200 as an etching gas.

As shown in FIGS. 21 to 24, the thickness variations (a and b) of the substrate protection layer 112 and the membrane layer 120 may be adjusted according to a flow rate of the oxygen-containing gas supplied to the gas mixture supply pipe 210 via the oxygen-containing gas supply regulator 250.

Figure 21:
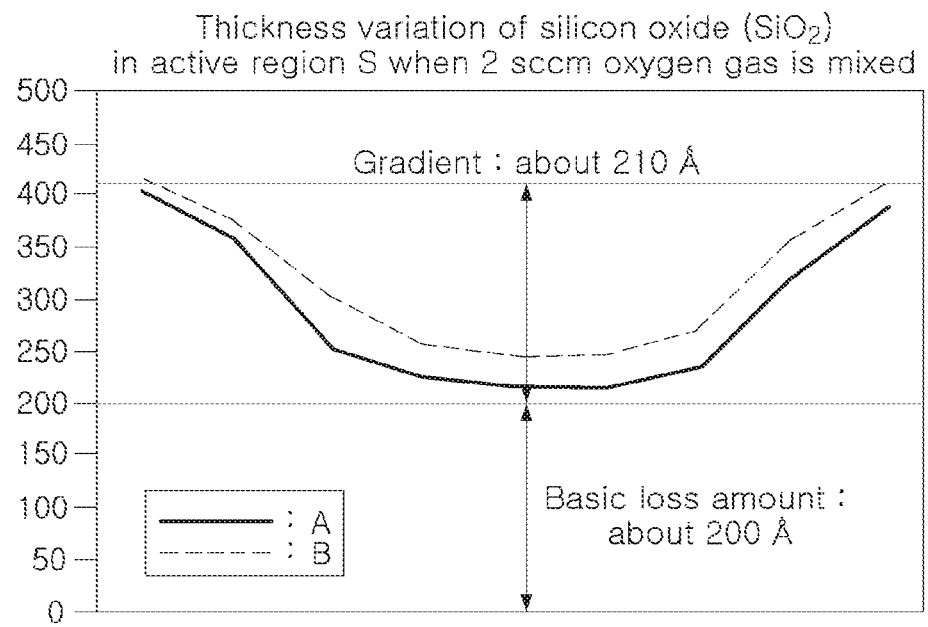
FIGS. 21 to 24 are graphs illustrating the tendency of thickness variations depending on supply of an oxygen-containing gas, respectively.

As shown in FIG. 21, when 2 standard cubic centimeter per min (sccm) oxygen gas was supplied by the oxygen-containing gas supply regulator 250, the thickness variations (a and b) of the substrate protection layer 112 and the membrane layer 120 were about 210 Å.

Figure 22:
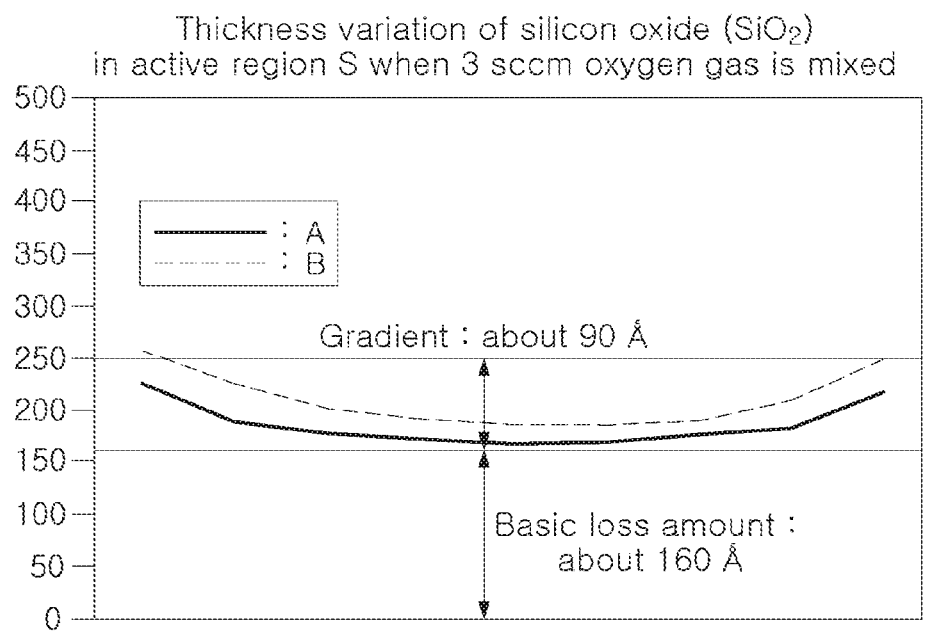

As shown in FIG. 22, when 3 sccm oxygen gas was supplied by the oxygen-containing gas supply regulator 25, the thickness variations (a and b) of the substrate protection layer 112 and the membrane layer 120 were about 90 Å.

As shown in FIG. 23, when 4 sccm oxygen gas is supplied by the oxygen-containing gas supply regulator 25, the thickness variations (a and b) of the substrate protection layer 112 and the membrane layer 120 were about 50 Å.

Figure 24:
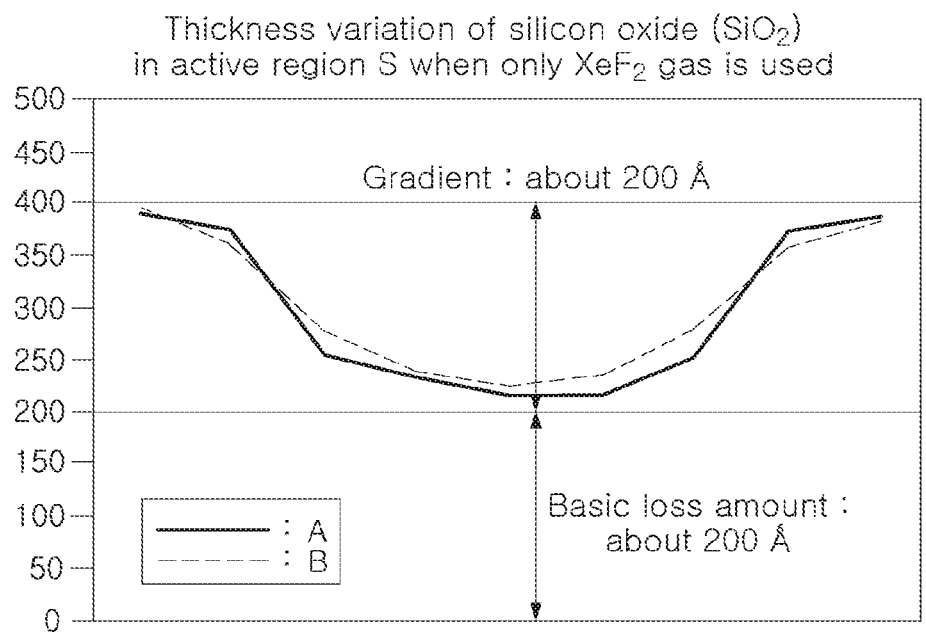

However, as shown in FIG. 24, when only the halide-based gas was used as an etching gas without supplying the oxygen-containing gas, the thickness variations (a and b) of the substrate protection layer 112 and the membrane layer 120 were about 200 Å.

As described above, a supply amount of the oxygen-containing gas may be controlled while using the gas mixture of the halide-based gas and the oxygen-containing gas as an etching gas. Thus, the thickness variations (a and b) of the substrate protection layer 112 and the membrane layer 120 may be reduced.

Figure 25:
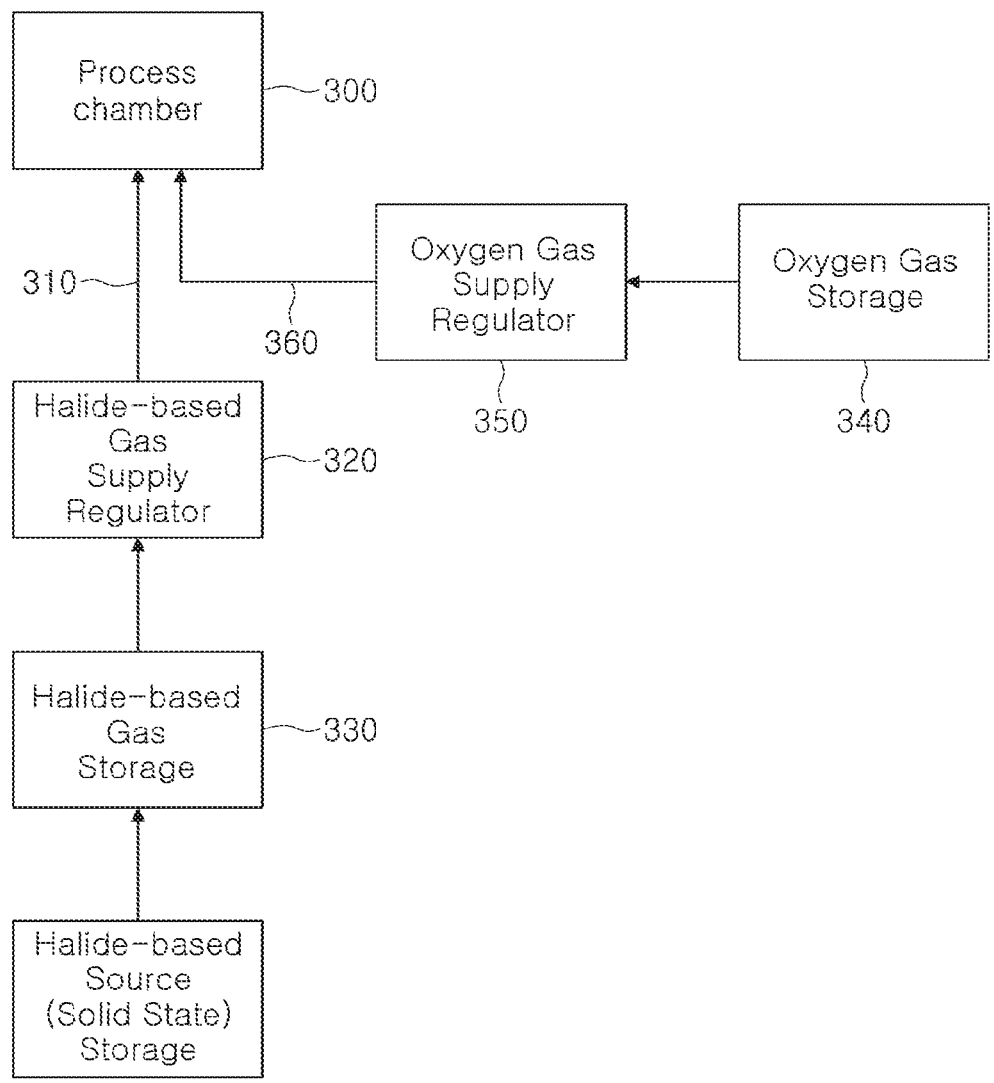
FIG. 25 is a configuration diagram illustrating a modified example of a manufacturing apparatus used to manufacture a bulk acoustic wave resonator, according to an example.

FIG. 25 is a configuration diagram illustrating a modified example of a manufacturing apparatus used in a method of manufacturing a bulk acoustic wave resonator, according to an example.

As shown in FIG. 25, a process chamber 300 for a removal process of the sacrificial layer 180 (see FIG. 17) is provided, and a halide-based gas and an oxygen-containing gas are supplied to the process chamber 300.

The halide-based gas may be supplied to the process chamber 300 via a halide-based gas supply pipe 310 connected to the process chamber 300, and the oxygen-containing gas may supplied to the process chamber 300 via an oxygen-containing gas supply pipe 360.

The halide-based gas (for example, xenon difluoride (XeF2)) is generated through a halide-based gas source stored in a solid state and is supplied to a halide-based gas supply pipe 310 by a halide-based gas supply regulator 320 after being stored in the halide-based gas storage 330. The halide-based gas supply regulator 320 may include, for example, one or more valves and/or other components configured to regulate a flow of the halide-based gas.

The oxygen-containing gas may be stored in an oxygen-containing gas storage 340 and may be supplied to an oxygen-containing gas supply pipe 360 via an oxygen-containing gas supply regulator 350. The oxygen-containing gas supply regulator 350 may include, for example, one or more valves and/or other components configured to regulate a flow of the oxygen-containing gas.

Thus, a gas mixture of the halide-based gas and an oxygen-containing gas may be supplied to the process chamber 300.

Figure 26:
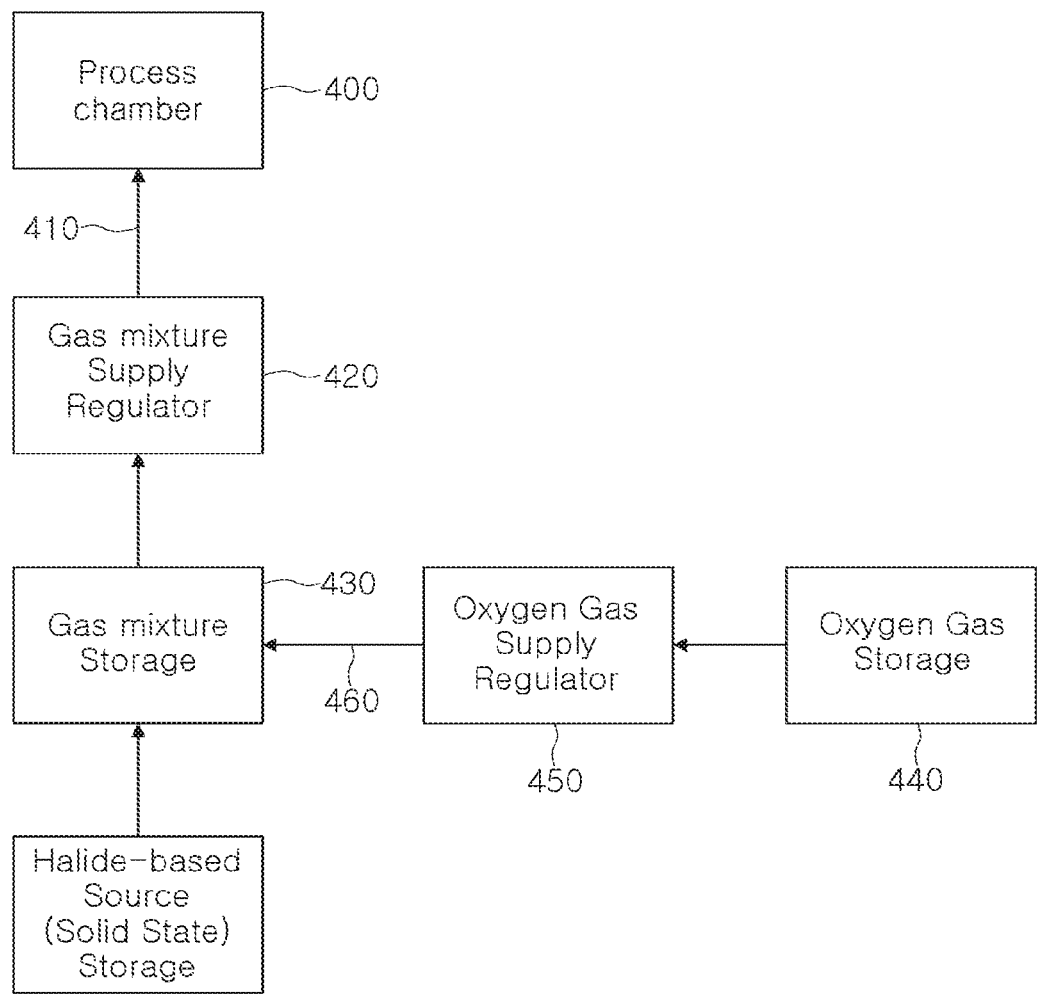
FIG. 26 is a configuration diagram illustrating another modified example of a manufacturing apparatus used to manufacture a bulk acoustic wave resonator, according to another example.

FIG. 26 is a configuration diagram illustrating another modified example of a manufacturing apparatus used in a method of manufacturing a bulk acoustic wave resonator according to another example.

As shown in FIG. 26, a process chamber 400 for a removal process of the sacrificial layer 180 (see FIG. 16) is provided, and a gas mixture of a halide-based gas and an oxygen-containing gas is supplied to the process chamber 400.

The gas mixture of a halide-based gas and an oxygen-containing gas is supplied to the process chamber 400 via a gas mixture supply pipe 410.

The halide-based gas (for example, xenon difluoride (XeF2)) is generated through a halide-based gas source stored in a solid state and is supplied to a gas mixture supply pipe 410 by a gas mixture supply regulator 420 after being stored in the gas mixture storage 430. The gas mixture supply regulator 420 may include, for example, one or more valves and/or other components configured to regulate a flow of the gas mixture.

The oxygen-containing gas may be stored in an oxygen-containing gas storage 440 and may be supplied to an oxygen-containing gas supply pipe 460 via an oxygen-containing gas supply regulator 450. The oxygen-containing gas supply regulator 450 may include, for example, one or more valves and/or other components configured to regulate a flow of the oxygen-containing gas. The oxygen-containing gas supply pipe 460 may be connected to the gas mixture storage 430 to supply the oxygen-containing gas to the gas mixture storage 430.

After the halide-based gas and the oxygen-containing gas are mixed in the gas mixture storage, they may be supplied to the process chamber 400 via the gas mixture supply regulator 420.

Thus, a gas mixture of the halide-based gas and the oxygen-containing gas may be supplied as an etching gas into the process chamber 400.

As described above, damage to a membrane layer and/or a substrate protection layer occurring during removal of a sacrificial layer may be reduced to prevent a decrease in resonator performance.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method of manufacturing a bulk acoustic wave resonator, comprising:
   forming a sacrificial layer on a substrate protection layer;
   forming a membrane layer on the substrate protection layer to cover the sacrificial layer; and
   forming a cavity by removing the sacrificial layer using a gas mixture comprising a halide-based gas and an oxygen-containing gas,
   wherein a mixture ratio of the halide-based gas to the oxygen-containing gas in the gas mixture is in a range of 1.5 to 2.4.

2. The method of claim 1, wherein the sacrificial layer comprises polysilicon.

3. The method of claim 1, wherein the halide-based gas is xenon difluoride ($XeF_2$).

4. The method of claim 1, wherein the membrane layer has a thickness variation less than or equal to 170 angstroms after the forming of the cavity.

5. The method of claim 1, wherein the substrate protection layer has a thickness variation less than or equal to 170 angstroms after the forming of the cavity.

6. The method of claim 1, further comprising:
   forming the gas mixture by mixing the oxygen-containing gas and the halide-based gas in a gas mixture supply pipe; and
   supplying the gas mixture to a process chamber from the gas mixture supply pipe,
   wherein the removing of the sacrificial layer is performed in the process chamber.

7. The method of claim 1, further comprising:
   forming the gas mixture by mixing the oxygen-containing gas and the halide-based gas in a process chamber,
   wherein the removing of the sacrificial layer is performed in the process chamber.

8. The method of claim 1, further comprising:
   forming the gas mixture by mixing the oxygen-containing gas and the halide-based gas in a gas mixture storage; and
   supplying the gas mixture to a process chamber from the gas mixture storage,
   wherein the removing of the sacrificial layer is performed in the process chamber.

9. A bulk acoustic wave resonator, comprising:
   a substrate;
   a substrate protection layer disposed on a top surface of the substrate;
   a membrane layer forming a cavity together with the substrate;
   a resonance part disposed on the membrane layer; and
   an inlet configured to connect the cavity to an external component,
   wherein either one or both of a thickness of the membrane layer and a thickness of the substrate protection layer increases as a distance from the inlet increases, and
   wherein a thickness variation of the membrane layer is 170 angstroms or less.

10. The bulk acoustic wave resonator of claim 9, wherein a ratio of half a width of an active region of the bulk acoustic wave resonator to either one or both of a thickness variation of the substrate protection layer and the thickness variation of the membrane layer is greater than 0.0150 and less than 0.0200.

11. The bulk acoustic wave resonator of claim 9, wherein the resonance part comprises:
    a bottom electrode disposed on the membrane layer,
    a piezoelectric layer disposed to cover at least a portion of the bottom electrode, and
    a top electrode disposed to cover at least a portion of the piezoelectric layer, and
    wherein the bottom electrode and the top electrode are formed of molybdenum or a molybdenum-containing alloy.

12. The bulk acoustic wave resonator of claim 9, wherein the resonance part comprises:
    a bottom electrode disposed on the membrane layer,
    a piezoelectric layer disposed to cover at least a portion of the bottom electrode, and
    a top electrode disposed to cover at least a portion of the piezoelectric layer, and
    wherein the bulk acoustic wave resonator further comprises an insertion layer disposed below a portion of the piezoelectric layer.

13. The bulk acoustic wave resonator of claim 9, wherein the substrate protection layer has a thickness variation of 170 angstroms or less.

14. The bulk acoustic wave resonator of claim 9, wherein the thickness of the substrate protection layer in an active region of the bulk acoustic wave resonator is in a range of 10,000 angstroms to 9,830 angstroms, and
    wherein the thickness of the membrane layer in the active region is in a range of 500 angstroms to 330 angstroms.

15. The bulk acoustic wave resonator of claim 9, wherein the substrate protection layer comprises silicon oxide or silicon nitride.

16. The bulk acoustic wave resonator of claim 9, wherein the membrane layer comprises silicon oxide or silicon nitride.

17. A bulk acoustic wave resonator, comprising:
    a substrate;
    a substrate protection layer disposed on a top surface of the substrate;
    a membrane layer forming a cavity together with the substrate;
    a resonance part disposed on the membrane layer; and
    an inlet configured to connect the cavity to an external component, wherein either one or both of a thickness of the membrane layer and a thickness of the substrate protection layer increases as a distance from the inlet increases, and wherein a ratio of half a width of an active region of the bulk acoustic wave resonator to either one or both of a thickness variation of the substrate protection layer and a thickness variation of the membrane layer is greater than 0.0150 and less than 0.0200.

18. A bulk acoustic wave resonator, comprising:

a substrate;

a substrate protection layer disposed on a top surface of the substrate;

a membrane layer forming a cavity together with the substrate;

a resonance part disposed on the membrane layer; and an inlet configured to connect the cavity to an external component, wherein either one or both of a thickness of the membrane layer and a thickness of the substrate protection layer increases as a distance from the inlet increases, wherein the thickness of the substrate protection layer in an active region of the bulk acoustic wave resonator is in a range of 10,000 angstroms to 9,830 angstroms, and wherein the thickness of the membrane layer in the active region is in a range of 500 angstroms to 330 angstroms.

* * * * *